United States Patent [19]

Haight et al.

[11] Patent Number: 5,027,003

[45] Date of Patent: Jun. 25, 1991

[54] READ/WRITE SWITCHING CIRCIT

[75] Inventors: Michael H. Haight, Pottsboro; Mark A. Wolfe, Dallas, both of Tex.

[73] Assignee: Texas Instruments Incorporated, Dallas, Tex.

[21] Appl. No.: 458,914

[22] Filed: Dec. 29, 1989

[51] Int. Cl.$^5$ .................. H03K 17/56; H03K 19/173
[52] U.S. Cl. ........................... 307/242; 307/443; 307/465; 365/189.04
[58] Field of Search ............. 307/242, 249, 455, 456, 307/468, 494, 498, 271, 329, 356, 573, 265, 509, 603, 608, 243, 443, 473, 465; 330/280, 285, 151 X, 51, 9; 365/227, 189.01

[56] References Cited

U.S. PATENT DOCUMENTS

| | | | |
|---|---|---|---|
| 3,115,612 | 12/1963 | Slavin | 307/249 |
| 3,631,355 | 12/1971 | Vail | 307/242 |
| 4,357,577 | 11/1982 | Smither | 330/9 |
| 4,439,693 | 3/1984 | Lucas et al. | 330/9 |
| 4,495,470 | 1/1985 | Bristol | 330/9 |
| 4,617,481 | 10/1986 | Masuda | 328/127 |
| 4,667,312 | 5/1987 | Doung et al. | 365/189.01 |
| 4,864,542 | 9/1989 | Oshima et al. | 365/189.01 |

Primary Examiner—Stanley D. Miller
Assistant Examiner—Toan Tran
Attorney, Agent, or Firm—B. Peter Brandt; Melvin Sharp; N. Rhys Merrett

[57] ABSTRACT

A read/write configuration (44) is provided for switching signals between a source (46) and either a single output (60) or a plurality of outputs (60) and (62). A control circuit (68) operates to control a signal switching circuit (64) and a power supply switching circuit (66) in response to a control signal input thereto. More particularly, in a reading mode, the switches within signal switching circuit (64) are opened while the switch within power supply switching circuit (66) is closed. Further, in a writing mode, the switches within signal switching circuit (64) are closed while the switch within power supply switching circuit (66) is opened.

32 Claims, 2 Drawing Sheets

READ/WRITE SWITCHING CIRCIT

TECHNICAL FIELD OF THE INVENTION

This invention relates to integrated circuitry and more particularly to an apparatus and methodology of switching an amplified source component in order to either read or write thereto.

BACKGROUND OF THE INVENTION

Amplification circuits used to amplify signals from a source so that the source signal may be read may also require a configuration which permits writing to the source. In other words, a bidirectional scheme may be necessary such that the circuit which comprises the source for purposes of reading from the amplifier is alternatively configured to be the load in order to write thereto. In these bidirectional applications, the prior art solutions therefor may create electrical noise, additional mechanical connections and added expense.

An existing prior art configuration for permitting both reading from an amplified source and writing to the source requires the use of mechanical jumpers in order to write to the source. The use of mechanical jumpers requires manual adjusting of the jumpers when either writing or reading is desired. Additionally, the use of a mechanical connection may give rise to increased electrical noise, extra leads and connectors and additional costs in the construction and utilization thereof. Further, the prior art mechanical connections may create increased stray capacitance and/or inductance. The use of mechanical componentry also decreases reliability and requires more area for accommodating the physical requirements of the mechanical parts, thereby yielding smaller packing densities for the application utilizing the read/write configuration.

Therefore, a need has arisen for a read/write switching circuit and methodology which ameliorates the problems identified above.

SUMMARY OF THE INVENTION

In accordance with the present invention, an apparatus and methodology are provided which substantially eliminate or reduce disadvantages and problems associated with prior schemes for implementing a read/write amplifier configuration.

A circuit constructed in accordance with the present invention includes an amplifier having an input and an output. Further included within the inventive circuit is an input circuit for receiving a control signal. A switching circuit is also provided which is responsive to the control signal and operable to connect the amplifier output to the amplifier input. Another feature which may be included in the inventive circuit is a switching circuit for selectively connecting and disconnecting a power supply to the amplifier included within the circuit.

A switching circuit constructed in accordance with the present invention may further include a second output and a second input. A second switching circuit may be provided which is responsive to the control signal and operable to connect the second output to the second input.

The inventive circuitry and methodology of the present invention gives rise to numerous technical advantages. The present invention provides for a reduction of mechanical connections such as jumper plugs or wires. This reduction creates the technical advantage of a reduction in assembly costs. Further, there is the technical advantage of reduced stray capacitance and inductance. Another technical advantage of the present invention is the faster transition between the read and write processes. Still another technical advantage is increased reliability from the use of more integrated componentry and less external connections. An additional technical advantage is the ease in manufacture of an all electrical configuration. More particularly, the inventive circuitry discussed herein may be integrated within a chip comprising the amplifier thereby giving rise to the technical advantages of further cost reduction and further reduction in stray capacitance and/or inductance.

DETAILED DESCRIPTION OF THE INVENTION

Figure 1A:
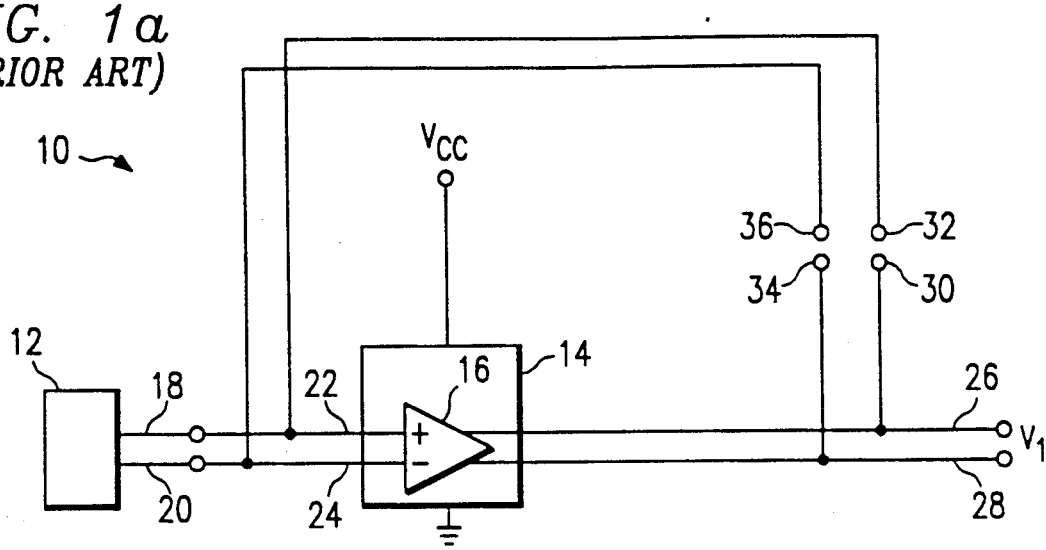
FIG. 1a illustrates a prior art configuration for providing an amplified signal from a source component.

FIG. 1a illustrates a prior art read/write configuration indicated generally at 10. Configuration 10 includes a source 12 which is coupled to an amplification stage 14. Amplification stage 14 includes an amplifier 16 therein. A power supply voltage, $V_{CC}$, is connected to amplifier stage 14 in order to provide power to amplifier 16.

Source 12 includes a first terminal 18 and a second terminal 20 in order to provide electrical access to the components therein. Amplifier 16 includes a noninverting input 22 and an inverting input 24. Further, amplifier 16 includes a first output 26 and a second output 28. Noninverting input 22 and inverting input 24 are operable to receive an input signal from source 12 to be amplified by amplification stage 14. This amplified signal $V_{CC}$ is output via first and second outputs 26 and 28. Therefore, a signal provided by source 12 may be amplified and read from outputs 26 and 28.

Configuration 10 illustrated in FIG. 1a further includes a first pair of feedback terminals 30 and 32 connected to first output 26 and noninverting input 22, respectively. Similarly, configuration 10 includes a second pair of feedback terminals 34 and 36 connected to second output 28 and inverting input 24, respectively. As will be discussed in more detail below, feedback terminals 30, 32, 34 and 36 may be coupled in order to permit writing to source 12 from first and second outputs 26 and 28.

Figure 1B:
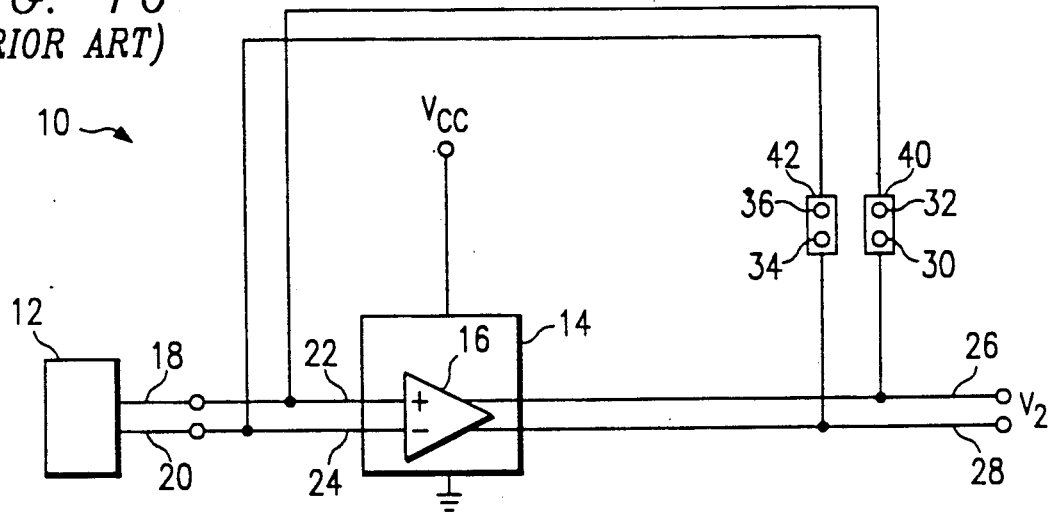
FIG. 1b illustrates a prior art configuration for writing to a source component.

FIG. 1b illustrates the prior art read/write configuration 10 of FIG. 1a connected in a write-to-source mode. A first jumper 40 is connected between feedback terminals 30 and 32. Similarly, a second jumper 42 is connected between feedback terminals 34 and 36. Accordingly, first jumper 40 effectively connects first output* 26 to noninverting input 22. Similarly, second jumper 42 effectively connects second output 28 to noninverting input 24. With the connections of first and second jumpers 40 and 42 as noted, a voltage signal, $v_2$, connected to outputs 26 and 28 will be connected to first terminals 18 and 20 of source 12. A typical application in which this jumper configuration would be utilized is where source 12 comprises a hard disk to which a signal must be written. In particular, under prior art schemes, the configuration shown in FIG. 1b is used to write a servo track signal to the hard disk in order to control the speed of the hard disk platter. More particularly, jumpers 40 and 42 are connected as shown and an input signal, $v_2$, is applied to outputs 26 and 28. This signal is written to source 12 which in the present example comprises a hard disk. The platter speed will thereafter be based upon the servo track unless it is later overwritten by a new servo track. After the servo track is written, jumpers 40 and 42 in the prior art are removed. This process typically requires a clean room environment in order to prevent contaminants from entering the unsealed componentry during the writing process.

From the discussion above, it may be appreciated that in order to accomplish a read/write configuration in the prior art, the use of mechanical jumpers may be necessary. The mechanical jumpers give rise to numerous problems in the construction, utilization and resulting output signals associated with the prior art configuration. In particular, the construction of the prior art configuration requires additional mechanical componentry having increased likelihood of failure. Further, the use of mechanical componentry consumes a greater area of space, thereby increasing device size. Still further, the assembly of a configuration requiring mechanical connections gives rise to a larger assembly cost. The utilization of mechanical jumpers creates problems in that stray capacitance and/or inductance may be associated with the use thereof. Additionally, the mechanical jumpers are of a limited reliability and may fail, thereby rendering the circuit associated therewith inoperative. Valuable time may also be consumed in the transfer of first and second jumpers 40 and 42 between the two different above-noted configurations. The present invention, however, provides for electrical switching between the read and write configurations, thereby substantially reducing or eliminating the disadvantages associated with the prior art.

Figure 2:
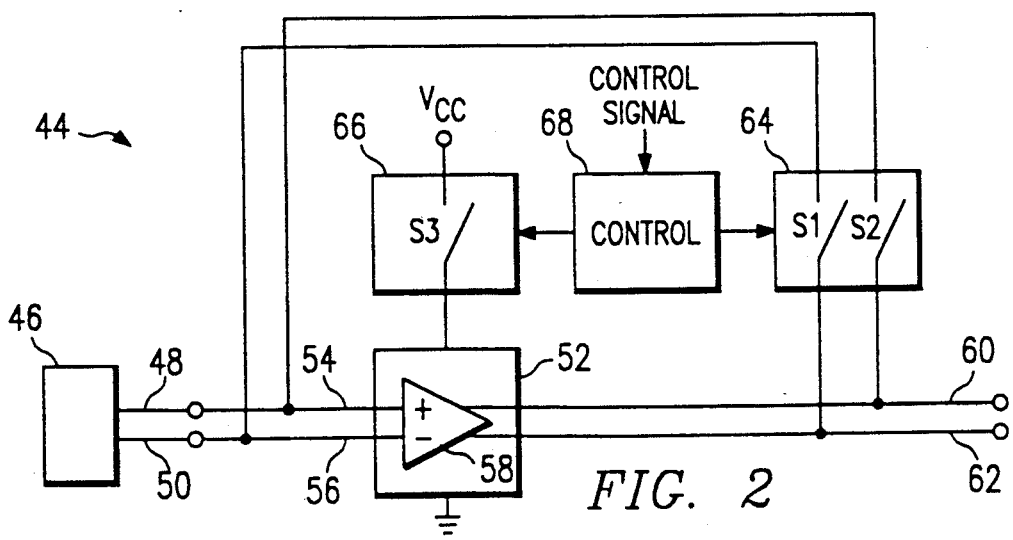
FIG. 2 illustrates a block diagram of the present invention.

FIG. 2 illustrates a block diagram of the read/write configuration of the present invention indicated generally at 44. A source 46 includes a first terminal 48 and a second terminal 50. First and second terminals 48 and 50 are in general connected to an amplification stage 52. In particular, first terminal 48 and second terminal 50 are connected to a noninverting input 54 and an inverting input 56, respectively, of an amplifier 58 within amplification stage 52. Amplifier 58 may comprise a video amplifier or an operational amplifier. Amplifier 58 includes a first output 60 and a second output 62.

First and second outputs 60 and 62 are connected in general to a signal switching circuit 64. In particular, second output 62 is connected to an electronic switch, S1, within signal switching circuit 64. Similarly, first output 60 of amplifier 58 is connected to an electronic switch, S2, included within signal switching circuit 64. Switch S1 is configured and operable to connect second output 62 of amplifier 58 to inverting input 56 of amplifier 58. Similarly, switch S2 is configured and operable to connect first output 60 of amplifier 58 to noninverting input 54 of amplifier 58.

A power supply voltage, $V_{CC}$, is connected to a power supply switching circuit 66. Power supply switching circuit 66 includes an electronic switch, S3, configured and operable to connect the power supply voltage $V_{CC}$ to amplifier 58 within amplification stage 52. A control circuit 68 is operable to receive a control signal in order to control the actions of switches S1, S2 and S3 in response to the received control signal.

The operation of read/write configuration 44 is as follows. In general, configuration 44 may operate to either read an amplified signal from source 46, or alternatively to write a signal to source 46. More particularly, a control signal is sent to control circuit 68 to indicate whether reading or writing is desired. In particular, in the read mode, the control signal and control circuit 68 act to open switches S1 and S2 and close switch S3. In this instance, power supply switching circuit 66 allows supply voltage $V_{CC}$ to provide power to amplifier 58 within amplification stage 52. Further, because switches S1 and S2 are open, both first and second outputs 60 and 62 are unaffected by the lines connected to signal switching circuit 64. As a result, a signal provided at first and second terminals 48 and 50 by source 46 will be input to and amplified by amplifier 58 within amplification stage 52. Accordingly, an amplified output signal is provided on first and second outputs 60 and 62.

In order to effect the write mode, the control signal causes control circuit 68 to close switches S1 and S2 while opening switch S3. In this instance, first output 60 is connected via switch S2 to noninverting input 54. Similarly, second output 62 is connected via switch S1 to inverting input 56. As a result, a signal may be applied to outputs 60 and 62 which will feed back to first and second terminals 48 and 50, respectively, of source 46. Accordingly, this signal may be written to source 46. It should also be noted that the opening of switch S3 in the writing mode disconnects the power supply voltage from the amplification stage 52. Therefore, amplifier 58 will be disabled and will not amplify the signal which is fed back via switches S1 and S2.

From the above, it may be appreciated that the present invention permits either reading from or writing to a source component around an amplification stage without the need for mechanical jumpers. Therefore, the numerous advantages previously noted are realized. Still further, in the example noted above where source 46 comprises a hard disk, the disk may be written subsequent to the packaging thereof without the need to disturb the disk package, but rather by use of a control signal applied thereto.

Additionally, while amplifier 58 is shown in FIG. 2 as including two outputs 60 and 62, it should be understood that an operational amplifier configuration could be implemented having a single output and both inverting and noninverting inputs. Accordingly, the present invention may be altered by one skilled in the art to permit switching between the single output and either input in order to permit writing to the source connected thereto.

Figure 3:
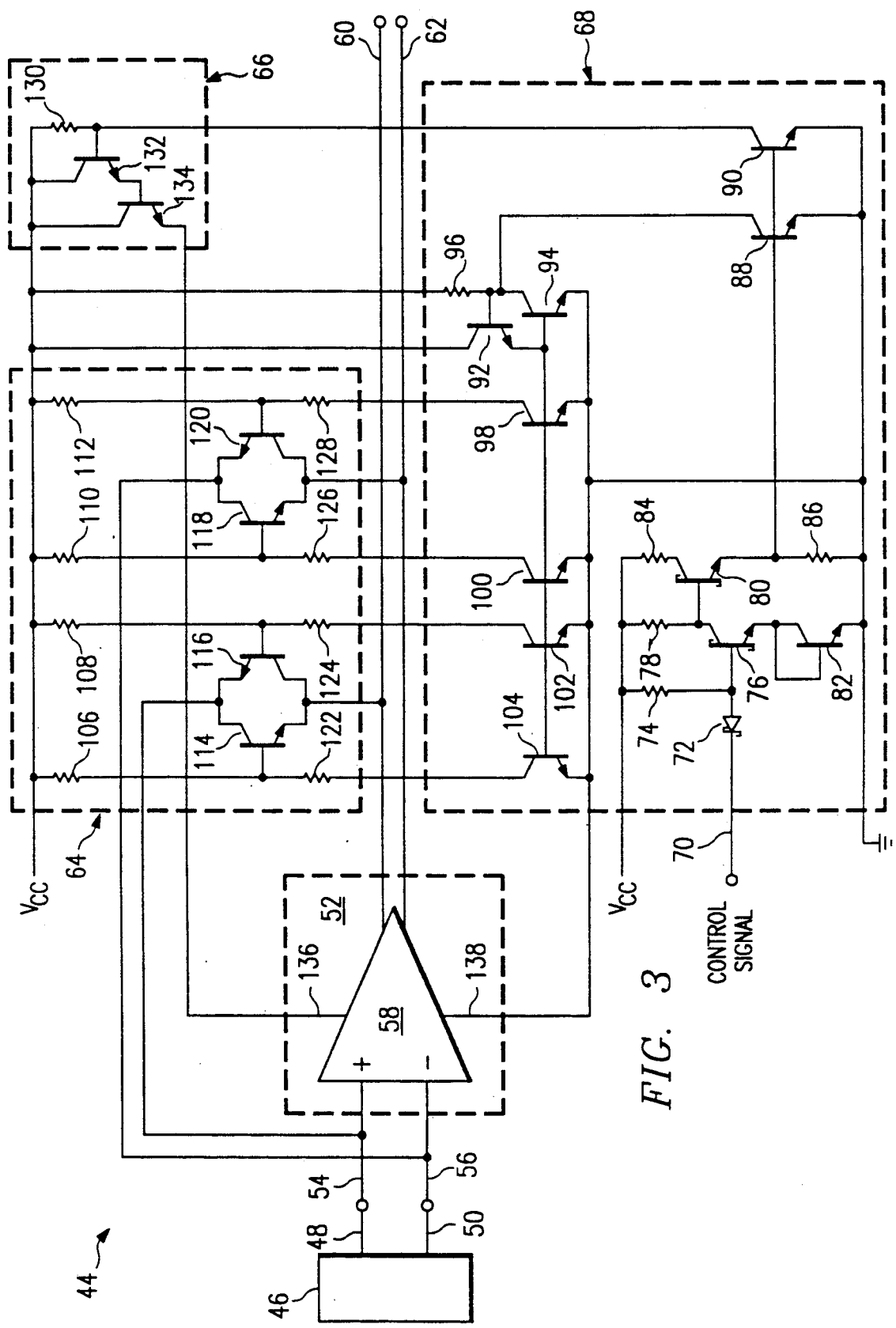
FIG. 3 illustrates a schematic diagram of the preferred implementation of the present invention.

FIG. 3 illustrates a schematic diagram of the preferred embodiment of read/write configuration 44 illustrated in FIG. 2. The block components shown in FIG. 2 are shown in phantom in FIG. 3 where each block contains the preferred components to effect the inventive results as discussed in connection with FIG. 2.

Control circuit 68 includes an input 70 for receiving the control signal. Input 70 is connected to the output of a schottky diode 72. The input of schottky diode 72 is connected to a resistor 74 and to the base of a transistor 76. Resistor 74 is further connected to $V_{CC}$. The collector of transistor 76 is connected to a resistor 78 as well as to the base of a transistor 80. The emitter of transistor 76 is connected to both the base and the collector of a transistor 82. The emitter of transistor 82 is connected to ground. Resistor 78 is further connected to the power supply voltage $V_{CC}$. The collector of transistor 80 is connected to a resistor 84 which is further connected to the power supply voltage $V_{CC}$. The emitter of transistor 80 is connected to a resistor 86, which is further connected to ground.

The emitter of transistor 80 is also connected to the bases of a transistor 88 and a transistor 90. The emitters of both transistors 88 and 90 are connected to ground. The collector of transistor 88 is connected to the base of a transistor 92, the collector of a transistor 94, and to a resistor 96, which is connected to the power supply voltage, $V_{CC}$. The emitter of transistor 92 is connected to the base of transistor 94, which is connected to the bases of transistors 98, 100, 102 and 104. The emitters of transistors 94, 98, 100, 102 and 104 are all connected to ground.

Signal switching circuit 64 includes four resistors 106, 108, 110 and 112, each of which is connected to the power supply voltage $V_{CC}$. Each of resistors 106, 108, 110 and 112 are also connected to the base of a respective transistor 114, 116, 118 and 120. The base of transistor 114 is connected to a resistor 122, which is further connected to the collector of transistor 104. Similarly, the base of transistor 116 is connected to a resistor 124, which is further connected to the collector of transistor 102. The emitter of transistor 114 is connected to the collector of transistor 116, and both are connected to first output 60 of amplifier 58. The collector of transistor 114 is connected to the emitter of transistor 116, and both are further connected to noninverting input. 54 of amplifier 58. Therefore, it may be appreciated that the combination of transistors 114 and 116 form a transmission gate operable to switch first output 60 to noninverting input 54 of amplifier 58. The base of transistor 118 is connected to a resistor 126, which is further connected to the collector of transistor 100. The base of transistor 120 is connected to a resistor 128, which is further connected to the collector of transistor 98. The emitter of transistor 118 is connected to the collector of transistor 120, and both are further connected to second output 62 of amplifier 58. The collector of transistor 118 is connected to the emitter of transistor 120, and both are further connected to inverting input 56 of amplifier 58. Therefore, the combination of transistors 118 and 120 form a transmission gate operable to switch second output 62 to inverting input 56 of amplifier 58.

Power supply switching circuit 66 includes a resistor 130 connected between power supply voltage $V_{CC}$ and the base of a transistor 132. The collector of transistor 132 is connected to the power supply voltage $V_{CC}$. The emitter of transistor 132 is connected to the base of a transistor 134. The collector of transistor 134 is connected to the power supply voltage $V_{CC}$ while the emitter thereof is connected to a positive power supply pin 136 of amplifier 58. A negative power supply pin 138 of amplifier 58 is connected to ground. The base of transistor 132 is further connected to the collector of transistor 90.

The operation of the circuitry within the blocks shown in FIG. 3 in both the read and write modes is in general as follows. Read/write configuration 44 in the preferred embodiment is in the reading mode when the control signal connected to input 70 is high. In this instance, schottky diode 72 is reversed biased and transistor 76 conducts to saturation due to the high signal at its base. Transistor 82 is conducting due to the high voltage placed at its base from the emitter of transistor 76. Since both transistors 76 and 82 are conducting, the base of transistor 80 is connected to the saturation voltage of transistor 76 plus the base-to-emitter voltage of transistor 82. Therefore, transistor 80 is conducting. However, the base-to-emitter voltage utilized by transistor 80 leaves only the saturation voltage of transistor 76 in parallel with the bases of transistors 88 or 90. Accordingly, transistors 88 and 90 are insufficiently biased and are off. Because transistor 88 is off, its collector has no effect on transistors 92 and 94. Accordingly, transistor 92 is on because its base is connected through resistor 96 to the power supply voltage $V_{CC}$. Similarly, transistor 94 is on because its base is receiving power from the emitter of transistor 92. Transistors 98, 100, 102 and 104 will also therefore be on in that they mirror transistor 94. Accordingly, each of transistors 98, 100, 102 and 104 are acting to pull down the bases of transistors 120, 118, 116 and 114, respectively. Transistors 114, 116, 118 and 120 are turned off as long as the voltages at inputs 54 and 56 as well as the voltages at outputs 60 and 62 is larger than the base voltages of these transistors. In other words, transistors 114, 116, 118 and 120 are off so long as they are reverse biased. Because transistors 120, 118, 116 and 114 are turned off, first and second outputs 60 and 62 are not connected to noninverting and inverting inputs 54 and 56. Therefore, no feedback is occurring and the DC performance of amplifier 58 is unaffected by the components within signal switching circuit 64.

In the reading mode, transistor 132 is conducting because, its base is connected through resistor 130 to the power supply voltage $V_{CC}$, and is also unaffected by transistor 90 which is turned off. Transistor 134 is also conducting due to the power supply connected to its base by the emitter of transistor 132. As a result, power is further supplied via the emitter of transistor 134 to amplifier 58. Thus, from the aforesaid, it may be appreciated that in the reading mode amplifier 58 receives power and its outputs are not connected to its inputs. Accordingly, the amplifier will amplify an input signal received from source 46 and provide a corresponding output signal on its outputs 60 and 62.

In order to effect a write-to-source 46 from output 60 and 62, the control signal connected to input 70 is low. Schottky diode 72 is on because it is forward biased from the power supply voltage $V_{CC}$ through resistor 74 relative to the low control signal connected to input 70. Because schottky diode 72 is on, there is insufficient voltage to forward bias transistor 76 and therefore transistor 76 and transistor 82 are off. Transistor 80 is on because transistors 76 and 82 do not pull down the base thereof. Resistors 78, 84 and 86 provide sufficient current to turn on and saturate transistors 88 and 90. The collector of transistor 88 is pulling down the base of transistor 92 and therefore transistor 92 is off. Further, transistor 94 is off because transistor 92 is not providing power to the base thereof. As a result, transistors 98, 100, 102, and 104 are also all off. Accordingly, the bases of transistors 114, 116, 118 and 120 are connected through resistors 106, 108, 110 and 112, respectively, to the voltage supplied by the power supply voltage $V_{CC}$. This voltage is sufficient to maintain transistors 114, 116, 118 and 120 in an operating fashion. Accordingly, transistors 114 and 116 are connecting first output 60 to noninverting input 54. Similarly, transistors 118 and 120 are operating to connect second output 62 to inverting input 56.

Transistor 90 is also conducting in the write mode due to the positive supply voltage connected to its base from transistor 80. As a result, the base of transistor 132 is pulled down sufficiently and therefore transistor 132 is off. Further, transistor 134 is off because transistor 132 is not supplying power to the base thereto. As a result, no power is being supplied to positive power supply pin 136 of amplifier 58. Thus, amplifier 58 is inactive because it is not receiving a power supply signal.

From the aforesaid, it may be appreciated that in the writing mode, the outputs of amplifier 58 are connected to its respective inputs and no power supply voltage is connected to amplifier 58. Therefore, a signal applied between outputs 60 and 62 may be written to source 46 via the connections provided by transistors 114, 116, 118 and 120. More particularly, when first output 60 is of a higher potential than output 62, transistor 116 will operate to conduct this signal to noninverting input 54. The signal will continue through source 46 and will be returned to inverting input 56 via second terminal 50 of source 46. The signal will then continue from inverting input 56 and be conducted through transistor 118 to second output 62. In the opposite instance, that is, where second output 62 is of a higher potential than first output 60, the converse of this operation occurs. More particularly, in this instance, transistor 120 will conduct the signal from second output 62 to noninverting input 56 and second terminal 50 of source 46. This signal will continue through source 46 and first terminal 48 to noninverting input 54. Still further, this signal will be connected through transistor 114 from noninverting input 54 to first output 60. Thus, it may be appreciated that the combination of either transistor 116 and 118, or 120 and 114 will operate to switch the amplifier outputs to the source connected to the amplifier inputs in an alternative fashion, depending on whether first output 60 is positive or negative with respect to second output 62.

Numerous detailed considerations of the componentry and signals within read/write configuration 44 are as follows. The discussion of the control signal heretofore has been mentioned with respect to this signal being either high or low. The control signal will be "high" when it reaches a threshold defined as:

$$V = 2V_{BE} - V_{schottky\ diode} \quad \text{Eqn.1}$$

where,
$2V_{BE}$ is the voltage necessary to cause transistors 76 and 82 to conduct, and
$V_{schottky\ diode}$ is the voltage drop across schottky diode 72.

Thus, where the control signal exceeds this threshold voltage, transistor 76 and 82 will conduct as discussed above. Conversely, the control signal will be "low" when it is below the threshold voltage of Equation 1.

Transistor 80 provides a level translation so that transistors 88 and 90 may have grounded emitters. Resistor 86 is selected to insure a voltage great enough to turn transistors 88 and 90 on when the base voltage of transistor 80 is high. Therefore, the resistance value for resistor 86 is defined by the equation:

$$R \geq \frac{V_{BE88}}{I_{E80} - (I_{B88} + I_{B90})} \quad \text{Eqn. 2}$$

where,
$V_{BE88}$ is the base to emitter voltage for transistor 88,
$I_{E80}$ is the emitter current for transistor 80,
$I_{B88}$ is the base current for transistor 88, and
$I_{B90}$ is the base current for transistor 90.

Resistor 84 is to have a value to permit transistors 88 and 90 to saturate according to the resistance value of resistor 84 as governed by the equation:

$$R \leq \frac{V_{CC} - (V_{BE} + V_{sat80})}{\frac{V_{BE}}{R_{86}} + I_{B88} + I_{B90}} \quad \text{Eqn. 3}$$

where,
$V_{CC}$ is the power supply voltage,
$V_{VBE}$ is the base-to-emitter voltage drops across transistors 88 or 90,
$R_{86}V_{BE}$ is the current across resistor 86,
$I_{B88}$ is the base current for transistor 88, and
$I_{B90}$ is the base current for transistor 90.
$V_{sat80}$ is the collector to emitter saturation voltage across transistor 80

Resistor 78 is to be small enough to provide sufficient base current to saturate transistor 80. Accordingly, the resistance value of resistor 78 is governed by the equation:

$$R \leq \frac{V_{CC} - (V_{BE80} + V_{BE88})}{\frac{I_{C80}}{h_{fe80}}} \quad \text{Eqn. 4}$$

where,
$V_{CC}$ is the power supply voltage,
$V_{BE80}$ is the base to emitter voltage of transistor 80.
$V_{BE88}$ is the base to emitter voltage of transistor 88,
$I_{C80}$ is the collector current for transistor 80, and
$h_{fe80}$ is the gain for transistor 80.

The selection of components within signal switching circuit 64 is dependent upon the magnitude of the signal which will be input to outputs 60 and 62 in order to write to source 46. This writing signal is typically a switching current source. This switching current source is accomplished by placing a DC writing voltage, $V_{DC}$, at either output 60 or 62. When transistors 114, 116, 118 and 120 are turned on, they are to be kept saturated. The base current of these transistors is a function of resistors 106, 108, 110 and 112. Accordingly, the base current will depend on the resistance value of these resistors and therefore these resistors should be selected according to the equation:

$$R < \frac{V_{CC} - (V_{BE} + V_{DC})}{\frac{I_{write\ peak}}{h_{fe}}} \quad \text{Eqn. 5}$$

where
$V_{CC}$ is the power supply voltage,
$V_{BE}$ is the base-to-emitter voltage of transistors 114, 116, 118 and 120,
$V_{DC}$ is the DC voltage of the write signal,
$h_{fe}$ is the forward current gain of transistors 114, 116, 118 and 120, and $I_{write\ peak}$ is the top current used to write to source 46 via outputs 60 and 62.

In the read mode, transistor 88 is off and transistors 92, 94, 98, 100, 102 and 104 are all on. Accordingly, resistor 96 is selected at a value sufficient to turn on transistors 92, 94, 96, 98, 100, and 104, in order to pull down the bases of transistors 114, 116, 118 and 120. Therefore, the resistance of resistor 96 is selected in accordance with the equation:

$$R = \frac{V_{CC} - 2V_{BE}}{I_{B\ transmission\ gate}} \quad \text{Eqn. 6}$$

where, $V_{CC}$ is the power supply voltage, $2V_{BE}$ is the base-to-emitter voltage of transistors 92 and 94, and $I_{B\ transmission\ gate}$ is the collective base current of the transmission gates including transistors 114, 116, 118 and 120.

Resistors 122, 124, 126 and 128 are optional resistors that are typically process dependent. These resistors are utilized to prevent problems with reverse breakdown when the base of the transmission gate transistors 114, 116, 118 and 120 are pulled down by transistors 98, 100, 102 and 104, respectively. Accordingly, resistors 122, 124, 126 and 128 are selected to prevent the bases of transistors 114, 116, 118 and 120 from getting pulled too low such that reverse breakdown problems could occur.

The sizing of transistor 88 which turns off transistors 92, 94, 98, 100, 102 and 104 is selected to have as small a $V_{CE}$ as possible given the collector current through resistor 96 and the base current restrictions of resistors 84 and 86.

Although the detailed discussion above has been made in reference to bipolar transistors, it should be understood that different electronic switching elements such as MOSFETS or the like could be utilized by one skilled in the art in effecting the present invention without departing from the scope thereof. Thus, although the present invention has been described in detail, it should be understood that various departures, substitutions and alterations may be made hereto without departing from the spirit and scope of the present invention as defined in the appended claims.

What is claimed is:

1. A read/write circuit, comprising:
   an input terminal;
   an output terminal;
   an amplifier having an input coupled to the input terminal and an output coupled to the output terminal;
   a signal switching circuit coupled to a control signal and operable to connect said output terminal to said input terminal in response to the control signal;
   a supply switching circuit coupled to the control signal and operable to connect said amplifier to a supply voltage in response to the control signal.

2. The read/write switching circuit of claim 1 wherein said signal switching circuit operates to couple said output terminal to said input terminal and said supply switching circuit operates to decouple said supply voltage from said amplifier in response to said control signal comprising a predetermined level.

3. The read/write switching circuit of claim 1 wherein said input comprises a first input and said output comprises a first output and said signal switching circuit comprises a first signal switching circuit, and said amplifier further includes a second input and a second output, and further comprising a second signal switching circuit responsive to said control signal and operable to connect said second output to said second input.

4. The read/write switching circuit of claim 3 wherein said first and said second signal switching circuits open, and said supply switching circuit closes in response to said control signal comprising a predetermined level.

5. The read/write switching circuit of claim 1 wherein said supply switching circuit comprises:
   a first transistor having a base for coupling to said control signal, a collector for coupling to the supply voltage and an emitter; and
   a second transistor having a base for coupling to said emitter of said first transistor, a collector for coupling to the supply voltage and an emitter for coupling to a said amplifier.

6. The read/write switching circuit of claim 1 wherein said signal switching circuit comprises a transmission gate having a signal input coupled to said output, a signal output coupled to said input, and a control input responsive to said control signal.

7. The read/write switching circuit of claim 6 wherein said transmission gate comprises:
   a first transistor having a collector connected to said first output, an emitter connected to said first input and a base responsive to said control signal; and
   a second transistor having an emitter connected to said first output, a collector connected to said first input and a base responsive to said control signal.

8. The read/write switching circuit of claim 3 wherein said second signal switching circuit comprises a transmission gate having a signal input coupled to said second output, a signal output coupled to said second input, and a control input responsive to said control signal.

9. The read/write switching circuit of claim 8 wherein said transmission gate comprises:
   a first transistor having a collector connected to said second output, an emitter connected to said second input and a base responsive to said control signal; and
   a second transistor having an emitter connected to said second output, a collector connected to said second input and a base responsive to said control signal.

10. The read/write switching circuit of claim 1 wherein said amplifier comprises a video amplifier.

11. The read/write switching circuit of claim 1 wherein said amplifier comprises an operational amplifier.

12. A read/write switching circuit, comprising:
    first and second input terminals;
    first and second output terminals;
    an amplifier having a first and second input and a first and second output, said first and second inputs coupled to said first and second input terminals, respectively, and a first and second output coupled to said first and second output terminals, respectively;
    a first signal switching circuit responsive to a control signal and operable to connect said first output terminal to said first input terminal;

a second signal switching circuit responsive to said control signal and operable to connect said second output terminal to said second input terminal; and a supply switching circuit for coupling between a supply voltage and said amplifier and responsive to said control signal to disconnect said supply voltage from said amplifier.

13. The read/write circuit of claim 12 wherein said first and second signal switching circuits close, and said supply switching circuit opens in response to said control signal comprising a predetermined level.

14. The read/write circuit of claim 12 wherein said first and second signal switching circuits open, and said supply switching circuit closes in response to said control signal comprising a predetermined level.

15. The read/write circuit of claim 12 wherein said supply switching circuit comprises:
a first transistor having a base for coupling to said control signal, a collector for coupling to the supply voltage and an emitter; and
a second transistor having a base for coupling to said emitter of said first transistor, a collector for coupling to the supply voltage and an emitter for coupling to said amplifier.

16. The read/write circuit of claim 13 wherein said first signal switching circuit comprises a first transmission gate having a signal input coupled to said first output, a signal output coupled to said first input, and a control input responsive to said control signal, and wherein said second signal switching circuit comprises a second transmission gate having a signal input coupled to said second output, a signal output coupled to said second input, and a control input responsive to said control signal.

17. The read/write circuit of claim 16 wherein said first transmission gate comprises:
a first transistor having a collector connected to said first output, an emitter connected to said first input and a base responsive to said control signal; and
a second transistor having an emitter connected to said first output, a collector connected to said first input and a base responsive to said control signal; and
wherein said second transmission gate comprises:
a third transistor having a collector connected to said second output, an emitter connected to said second input, and a base responsive to said control signal; and
fourth transistor having an emitter connected to said second output, a collector connected to said second input and a base responsive to said control signal.

18. A method of switching in order to read/write, comprising the steps of:
receiving an input signal;
receiving a control signal;
coupling an output signal to an output of an amplifier;
coupling the input signal to an input of the amplifier;
selectively switching the output signal to the input signal in response to the control signal; and
selectively switching a supply voltage to the amplifier in response to the control signal.

19. The method of claim 18 wherein the input comprises a first input and the output comprises a first output, and further comprising the step of selectively switching a second output of the amplifier to a second input of the amplifier in response to the control signal.

20. The method of claim 19 wherein the first output is selectively switched to the first input and the second output is selectively switched to the second input in response to the control signal comprising a predetermined level.

21. The method of claim 18 wherein the output is selectively switched to the input and the supply voltage is selectively switched off from the amplifier in response to the control signal comprising a predetermined level.

22. The method of claim 18 wherein said step of selectively switching the supply circuit comprises:
operating a first transistor having a base for receiving the control signal and a collector for coupling to the supply voltage; and
operating a second transistor having a base for coupling to an emitter of the first transistor, a collector for coupling to the supply voltage and an emitter for coupling to the amplifier.

23. The method of claim 18 wherein said step of selectively switching the first output to the first input comprises operating transmission gate having a signal input coupled to the output, a signal output coupled to the input, and a control input responsive to the control signal.

24. The method of claim 23 wherein said step of operating the transmission gate comprises:
operating a first transistor having a collector connected to the first output, an emitter connected to the first input and a base responsive to the control signal; and
operating a second transistor having an emitter connected to the first output, a collector connected to the first input and a base responsive to the control signal.

25. The method of claim 19 wherein said step of selectively switching the second output to the second input comprises operating a transmission gate having a signal input coupled to the second output, a signal output coupled to the second input, and a control input responsive to the control signal.

26. The method of claim 25 wherein said step of operating the transmission gate comprises:
operating a first transistor having a collector connected to the second output, an emitter connected to the second input and a base responsive to the control signal; and
operating a second transistor having an emitter connected to the second output, a collector connected to the second input and a base responsive to the control signal.

27. The method of claim 18 wherein the amplifier comprises a video amplifier.

28. The method of claim 18 wherein the amplifier comprises an operational amplifier.

29. A method of switching in order to read/write, comprising the steps of:
receiving a control signal;
receiving first and second input signals;
coupling the first and second input signals to the first and second inputs, respectively, of an amplifier;
coupling first and second output signals to the first and second outputs, respectively, of the amplifier;
selectively switching the first output signal to the first input signal in response to the control signal;
selectively switching the second output signal to the second input signal in response to the control signal;

selectively switching a supply voltage to the amplifier in response tot he control signal.

30. The method of claim 29 wherein the first output is selectively switched to the first input, the second output is selectively switched to the second input and the supply circuit is switched off from the amplifier in response to the control signal comprising a predetermined level.

31. The method of claim 29 wherein said step of selectively switching the first output to the first input comprises the step of operating a first transmission gate having a signal input coupled to the output, a signal output coupled to the input, and a control input responsive to the control signal, and said step of selectively switching the second output to the second input comprises the step of operating a first transmission gate having a signal input coupled to the second output, a signal output coupled to the second input, and a control input responsive to the control signal.

32. The method of claim 29 wherein said step of selectively switching the supply voltage comprises:
operating a first transistor having a base for receiving the control signal and collector for coupling to the supply voltage; and
operating a second transistor having a base for coupling to an emitter of the first transistor, a collector for coupling to the supply voltage and an emitter for coupling to the amplifier.

* * * * *